United States Patent
Zhang et al.

(10) Patent No.: US 6,608,325 B1
(45) Date of Patent: *Aug. 19, 2003

(54) TRANSISTOR AND SEMICONDUCTOR DEVICE HAVING COLUMNAR CRYSTALS

(75) Inventors: Hongyong Zhang, Kanagawa (JP);
Toru Takayama, Kanagawa (JP);
Yasuhiko Takemura, Kanagawa (JP);
Akiharu Miyanaga, Kanagawa (JP);
Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/477,705

(22) Filed: Jan. 5, 2000

Related U.S. Application Data

(62) Division of application No. 09/041,516, filed on Mar. 13, 1998, now Pat. No. 6,037,610, which is a division of application No. 08/593,552, filed on Jan. 30, 1996, now Pat. No. 5,818,076, which is a continuation of application No. 08/248,457, filed on May 24, 1994, now abandoned.

(30) Foreign Application Priority Data

May 26, 1993  (JP) ................................ 5-147003

(51) Int. Cl.⁷ ........................ H01L 29/04; H01L 29/76
(52) U.S. Cl. .................... 257/64; 257/66; 257/72; 257/255; 257/267
(58) Field of Search ................... 257/64, 66, 67, 257/70, 255, 627, 628, 72

(56) References Cited

U.S. PATENT DOCUMENTS

| | | |
|---|---|---|
| 4,766,477 A | 8/1988 | Nakagawa et al. ........... 257/66 |
| 5,010,033 A | 4/1991 | Tokunaga et al. |
| 5,147,826 A | 9/1992 | Liu et al. |
| 5,177,578 A | 1/1993 | Kakinoki et al. |
| 5,275,851 A | 1/1994 | Fonash et al. |
| 5,326,991 A | 7/1994 | Takasu |
| 5,403,772 A | 4/1995 | Zhang et al. |
| 5,426,064 A | 6/1995 | Zhang et al. ................... 438/48 |
| 5,481,121 A | 1/1996 | Zhang et al. |

(List continued on next page.)

FOREIGN PATENT DOCUMENTS

| | | |
|---|---|---|
| JP | 53-27371 | 3/1978 |
| JP | 60-143666 | 7/1985 |
| JP | 61-63017 | 4/1986 |
| JP | 64-050569 | 2/1989 |
| JP | 2-222546 | 9/1990 |

OTHER PUBLICATIONS

C. Hayzelden et al., "IIn SituTransmission Electron Microscopy Studies of Silicide–Mediated Crystallization of Amorphous Silicon" (3 pages).

A.V. Dvurechenskii et al., "Transport Phenomena in Amorphous Silicon Doped by Ion Implementation of 3d Metals", *Akademikian Lavrentev Prospekt* 13, 630090 Novosibirsk 90, USSR, pp. 635–640,1990.

T. Hempel et al., "Needle–Like Crystallization of Ni Doped Amorphous Silicon Thin Films", *Solid State Communications*, vol. 85, No. 11, pp. 921–924, 1993.

(List continued on next page.)

*Primary Examiner*—Minh Loan Tran
(74) *Attorney, Agent, or Firm*—Eric J. Robinson; Robinson Intellectual Property Law Office, P.C.

(57) ABSTRACT

A semiconductor device having high carrier mobility, which comprises a substrate provided thereon a base film and further thereon a crystalline non-single crystal silicon film by crystal growth, wherein, the crystals are grown along the crystallographic [110] axis, and source/drain regions are provided approximately along the direction of carrier movement which coincides to the direction of crystal growth. Moreover, the electric conductivity along this direction of crystal growth is higher than any in other directions.

116 Claims, 10 Drawing Sheets

U.S. PATENT DOCUMENTS

| | | |
|---|---|---|
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |
| 5,569,936 A | 10/1996 | Zhang et al. .................. 257/66 |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,700,333 A | 12/1997 | Yamazaki et al. |
| 5,818,076 A * | 10/1998 | Zhang et al. .................. 257/64 |
| 5,895,933 A | 4/1999 | Zhang et al. |
| 5,942,768 A | 8/1999 | Zhang |
| 6,037,610 A * | 3/2000 | Zhang et al. .................. 257/64 |
| 6,087,679 A | 7/2000 | Yamazaki et al. |
| 6,211,536 B1 | 4/2001 | Zhang |
| 6,285,042 B1 | 9/2001 | Ohtani et al. |
| 6,294,815 B1 | 9/2001 | Yamazaki et al. |

OTHER PUBLICATIONS

Kakkad ed al., "Crystallized Si Films by Low–Temperature Rapid Thermal Annealing of Amorphous Silicon", pp. 2069–2072, Mar. 1, 1989, Journal of Applied Physics, vol. 65, No. 5.

Kakkad et al., "Low Temperature Selective Crystallization of Amorphous Silicon", pp. 66–68, Aug. 1, 1989, Journal of Non–Crystalline Solids vol. 115.

Liu et al., "Selective Area Crystallization of Amorphous Silicon Films by Low–Temperature Rapid Thermal Annealing", pp. 660–662, Aug. 14, 1989, Applied Physics Letters, vol. 55, No. 7.

Liu et al., "Polycrystalline Silicon Thin Film Transistors on Corning 7059 Glass Substrates Using Short Time, Low–Temperature Processing", pp. 2554–2556, May 17, 1993, Applied Physics Letters, vol. 62, No. 20.

Specification and Drawings of U.S. patent application Ser. No. 08/633,307.

Specification and Drawings of U.S. patent application Ser. No. 08/670,122.

Specification and Drawings of U.S. patent application Ser. No. 08/807,737.

Specification and Drawings of U.S. patent application Ser. No. 09/139,662.

Specification and Drawings of U.S. patent application Ser. No. 09/144,538.

Specification and Drawings of U.S. patent application Ser. No. 09/222,185.

Specification and Drawings of U.S. patent application Ser. No. 09/778,082.

Sato et al., "Mobility Anisotropy of Electrons in Inversion Layers on Oxidized Silicon Surfaces", pp. 1950–1960, 1971, Physical Review B. vol. 4, No. 6.

Kishino et al., "Physics of VLSI Device", pp. 144–145, 1986, (with partial English translation).

* cited by examiner

TRANSISTOR AND SEMICONDUCTOR DEVICE HAVING COLUMNAR CRYSTALS

This application is a Divisional of Application Ser. No. 09/041,516 filed Mar. 13, 1998 now U.S. Pat. No. 6,037,610; which itself is a Division of application Ser. No. 08/593,552 filed Jan. 30, 1996, now U.S. Pat. No. 5,818,076; which is a Continuation of application Ser. No. 08/248,457 filed May 24, 1994, abandoned.

BACKGROUND OF THE INVENTION

1. Industrial Field of the Invention

The present invention relates to a semiconductor device comprising a thin film transistor (TFT) on an insulating substrate such as of glass, and it also relates to a process for fabricating the same.

2. Prior Art

Semiconductor devices comprising TFTs on an insulating substrate (such as a glass substrate) known heretofore include an active matrix-addressed liquid crystal display device using the TFTs for driving the matrices and an image sensor.

The TFTs utilized in those devices generally employ a thin film silicon semiconductor. Thin film semiconductors can be roughly classified into two; one is a type comprising amorphous silicon semiconductor (a-Si), and the other is a type comprising crystalline silicon semiconductors. Amorphous silicon semiconductors are most prevailing, because they can be fabricated relatively easily by a vapor phase process at a low temperature, and because they can be readily obtained by mass production. The physical properties thereof, such as electric conductivity, however, are still inferior as compared with those of a crystalline silicon semiconductor. Thus, to implement devices operating at even higher speed, it has been keenly demanded to establish a process for fabricating TFTs comprising crystalline silicon semiconductors. Known crystalline semiconductors include polycrystalline silicon, microcrystalline silicon, amorphous silicon partly comprising crystalline components, and semi-amorphous silicon which exhibits an intermediate state between crystalline silicon and amorphous silicon.

A thin film of a crystalline silicon semiconductor enumerated above can be fabricated by any of the following known processes:

(1) A process which comprises directly depositing a crystalline film in the step of film deposition;

(2) A process which comprises depositing an amorphous semiconductor film, and then irradiating a laser beam to the film to obtain a crystallized semiconductor by taking advantage of the laser beam energy; and (3) A process which comprises depositing an amorphous semiconductor film, and then applying thermal energy to crystallize the film to obtain a crystalline semiconductor.

With respect to the first process above, it is technologically unfeasible to form a uniform film having favorable semiconductor properties over the entire surface of the substrate. Moreover, this process is uneconomical, because it excludes the use of a low cost glass substrate due to the presence of a film deposition step which requires a temperature as high as 600° C. or even higher.

The second process can be exemplified by a process employing the most commonly used laser at present, i.e., an excimer laser. Considering the too small area of a laser beam can irradiate at a time, this process is still disadvantageous in that it can only afford a low throughput. Furthermore, the laser is not sufficiently stable to cover the entire surface of a large area substrate with a uniform film. Thus, it can be safely said that this process awaits a forthcoming technology.

The third process is superior to the first and the second processes above concerning its applicability to the formation of large area films. However, it also requires a high temperature of 600° C. or higher during the film deposition. This process again excludes the use of inexpensive glass substrates. Thus, it is required to further lower the heating temperature during the film formation.

In particular, even larger displays are required in the present day liquid crystal display devices. Accordingly, those devices keenly demand their implementation using larger glass substrates. A heating treatment is indispensable for the fabrication of semiconductors, however, shrinking and deformation occur on a glass substrate during the thermal treatment. These dimensional change in glass substrate considerably impair the precision at, for example, the mask alignment. Such an instability in dimensional precision has been found as a great problem in the process for fabricating semiconductors. The most widely used 7059 glass (a product of Corning Corp.) undergoes deformation at a temperature of 593° C. Accordingly, it cannot resist to the conventional thermal crystallization treatment without being deformed. Moreover, the step of thermal crystallization in the known processes consumes such a long time amounting to several tens, of hours, or even longer. It is therefore keenly demanded to develop a rapid step for the crystallization.

SUMMARY OF THE INVENTION

The, present invention provides a means for overcoming the aforementioned problems. More specifically, an object of the present invention is to provide a low-temperature and yet rapid process for fabricating thin films of crystalline silicon semiconductors by thermally crystallizing thin films of amorphous silicon. As a matter of course, the crystalline silicon semiconductor fabricated by the process according to the present invention yields properties well comparable to or even superior to those of the prior art silicon semiconductors, and can be utilized in the active regions of TFTs.

Thus, the present invention provides a semiconductor device having a high mobility, which comprises a substrate having thereon a base film and a crystalline non-single crystal silicon film grown along a particular direction, and source/drain regions are provided along a direction approximately in parallel with the direction of crystal growth and the direction along which the carriers move in the semiconductor device. The non-single crystal silicon film is grown along the crystallographic [110] axis, and yields a higher conductivity along this particular direction.

DETAILED DESCRIPTION OF THE INVENTION

Figure 1A:
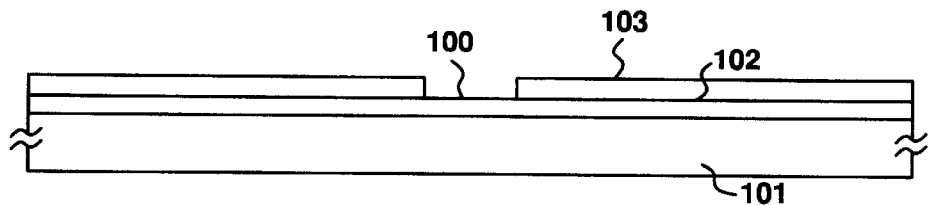
FIGS. 1(A) to 1(D) show schematically drawn step sequential cross section structures obtained in a process according to an embodiment of the present invention.
Figure 1B:
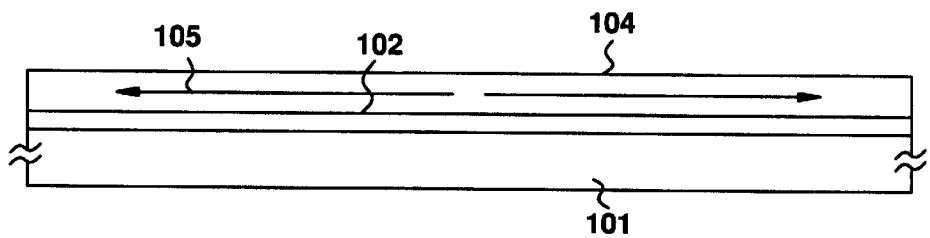
Figure 1C:
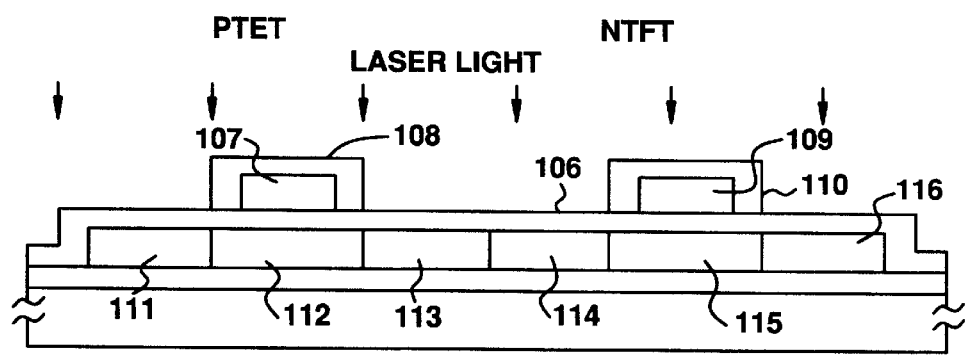
Figure 1D:
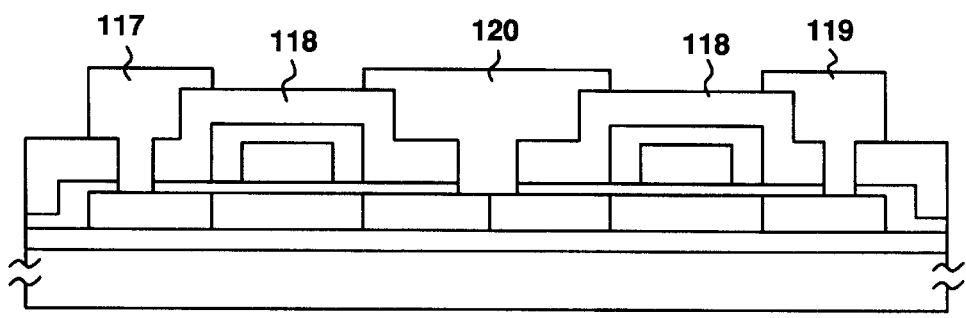

In the light of the aforementioned circumstances, the present inventors have extensively conducted experimentation and studied the process, for thermally crystallizing a film deposited by a CVD process or sputtering.

First, a thin film of amorphous silicon was deposited experimentally on a glass substrate, and was thermally crystallized to study the mechanism of crystallization. It was observed. that the crystal growth is initiated from the boundary between the glass substrate and amorphous silicon, and that it proceeds in such a manner to form columnar crystals perpendicular to the surface of the substrate after achieving a certain film thickness.

The aforementioned phenomena can be explained by the crystal nuclei (particular sites for the initiation of crystallization) that are present at the boundary between the glass substrate and the amorphous silicon film. Thus, the crystal growth occurs in a particular manner from these special sites. The crystal nuclei are believed to be metal impurities or crystalline components (considering the so-called crystallized glass, it is assumed that crystalline components of silicon oxide are present on the surface of the glass substrate) that are present in trace amount on the surface of the substrate.

The present inventors thought of intentionally introducing crystal nuclei to lower the crystallization temperature. Accordingly, as an attempt, a thin film of amorphous silicon was deposited after tentatively depositing a trace amount of a foreign metal on the substrate, and the thin film of amorphous silicon was heated thereafter for crystallization. As a result, it was confirmed that the deposition of several types of metals certainly lower the crystallization temperature of silicon. It was therefore assumed that particular types of metals function as crystal nuclei to provide sites to effect crystal growth. Thus, further study on the mechanism of crystallization was performed using the plurality of metal impurities which was capable of lowering the crystallization temperature.

Crystallization occurs in two steps, i.e., the initial stage of nucleation and the stage of crystal growth which occurs subsequent to the nucleation. The rate of the initial nucleation can be obtained by measuring, while maintaining the temperature constant, the time duration from the initiation of the reaction to the point at which fine crystals generate in spots. This rate of nucleation was found to be shortened in all of the thin films deposited on a trace amount of a metal impurity. Accordingly, the foreign matter introduced as the metal impurity was confirmed to function as crystal nuclei and to be effective in lowering the crystallization temperature. Furthermore, the growth of crystals after the nucleation was observed while changing the duration of heating. It was found unexpectedly that the deposition of certain types of metals considerably accelerates, not only the rate of nucleation, but also the rate of crystal growth of the thin film silicon deposited on the metal. The mechanism of rate acceleration is described in further detail hereinafter.

At any rate, it was found that a thin film of silicon having a sufficiently high degree of crystallization (crystallinity) can be obtained at an unprecedented low temperature of 580° C. or even lower and within a duration as short as about 4 hours, by first depositing a trace amount of a particular metal as a catalytic metal and depositing thereon a thin film of amorphous silicon, followed by crystallization by heating. Among the metals having the effect of accelerating the crystallization of amorphous silicon, the most effective was nickel. In this context, the present inventors selected nickel as the material for accelerating the crystallization. The outstanding effect of nickel can be realized by the following example. In a case of a thin film of amorphous silicon deposited by plasma CVD on an untreated substrate, i.e., a substrate of Corning 7059 glass having no trace amount of nickel thereon, the crystallization of the amorphous silicon thin film by heating at 600° C. under a nitrogen atmosphere requires a duration of 10 hours or longer. In contrast, a case of incorporating a trace amount of nickel in the form of a thin film between the amorphous silicon film and the substrate realizes a crystallized silicon film having a crystallinity well comparable to the film obtained above by heating for a duration of a mere 4 hours. The degree of crystallization was evaluated using Raman spectroscopy. This fact alone illustrates the outstanding effect of nickel on the crystallization of amorphous silicon.

As described in the foregoing, the crystallization of a thin film of amorphous silicon can be effected at a lower temperature and in a shorter duration of time by depositing a thin film containing nickel in trace amount before depositing the thin film of amorphous silicon. Thus, the detailed description below refers to a process utilizing the above effect in the fabrication of a TFT. Furthermore, as is described hereinafter, it is confirmed that the thin film of nickel exerts the same effect on amorphous silicon by forming it either on or under the amorphous silicon film, and that nickel in trace amount can be also incorporated by ion implantation. Accordingly, the term "adding nickel in trace amount" encompasses all these processes involving the incorporation of nickel in trace amount into amorphous silicon.

The method of adding nickel in trace amount is described first in detail. It is confirmed that the crystallization temperature can be lowered by incorporating nickel in trace amount by either depositing a thin film of nickel in trace amount directly on the substrate and depositing a thin film of amorphous silicon thereafter, or by depositing the thin film of amorphous silicon film before depositing the thin film of nickel in trace quantity. Furthermore, an effective film deposition can be realized by any means, such as sputtering, vapor deposition, coating, and spin coating. In depositing a thin film of nickel in trace amount on a substrate such as of Corning 7059 glass, however, the method of first depositing a thin film of silicon oxide on the substrate and depositing thereon nickel in trace quantity is preferred than that of directly depositing the thin film of nickel. A far effective film deposition can be implemented by employing the former method. Assumably, the key of realizing low temperature crystallization by adding nickel in trace amount is to bring silicon in direct contact with nickel. However, in the case of using Corning 7059 glass, the presence of components other than silicon in the glass presumably hinders the contact or the reaction between silicon and nickel.

The method of adding nickel in trace amount is not only limited to the contact deposition of a thin film of nickel either on or under the thin film of amorphous silicon. It is also confirmed effective to incorporate nickel into the thin film of silicon by means of ion implantation. The crystallization temperature of silicon can be lowered by adding nickel at a density of $1\times10^{15}$ atoms/cm$^3$ or higher, however, the incorporation of nickel atoms at a density of $1\times10^{21}$ atoms/cm$^3$ or higher results in a product other than elemental silicon. This can be observed by the change in Raman spectrogram. Accordingly, the practically useful range of nickel addition (catalytic metal addition) is from $1\times10^{15}$ atoms/cm$^3$ to $5\times10^{19}$ atoms/cm$^3$. Considering the use of this thin film silicon as a semiconductor in the active layer of a TFT, the preferred range of nickel concentration is from $1\times10^{15}$ atoms/cm$^3$ to $1\times10^{19}$ atoms/cm$^3$.

The characteristic features of the crystal growth and the crystal morphology which results from adding nickel in trace amount is described below. The assumable crystallization mechanism is further discussed thereafter.

In case of adding no nickel, random nucleation as described in the foregoing occurs from the crystal nuclei which are present in the boundary between the substrate and the thin film silicon. It is reported that the crystal growth occurs also randomly from those nuclei to form crystals oriented relatively in the crystallographic (110) or (111) planes. Thus, as a matter of course, crystals grown uniformly over the entire thin film can be obtained as a result.

The mechanism of crystal growth was confirmed using differential scanning calorimeter (DSC). A thin film of amorphous silicon deposited on a substrate by plasma-assisted CVD was placed inside a sample pan, and the temperature thereof was elevated at a constant rate. A distinguished exothermic peak attributed to crystallization was observed at about 700° C. The temperature of the exothermic reaction naturally shifts to the higher side with increasing rate of heating; the crystallization at a heating rate of 10° C./min was observed to occur at 700.9° C. Three runs each differed in heating rate were conducted according to Ozawa's method to obtain the activation energy of crystal growth after the initial nucleation. Thus, an activation energy of 3.04 eV was obtained. Furthermore, the observed reaction rate function was fitted with theoretical curves to determine the mechanism of the reaction. The best fit was found to be a curve based on the model of random nucleation and the subsequent crystal growth. Thus, the model of random nucleation from the crystallization sites at the boundary between the substrate and the silicon film or the like and the subsequent crystal growth was found acceptable.

The same DSC measurement was carried on a sample containing nickel in trace quantity. The crystallization in this case at a heating rate of 10° C./min was found to be slightly lowered to 619.9° C. Furthermore, the activation energy calculated based on the data obtained from the series of runs was found to be about 1.87 eV. This shows quantitatively an evidence for the acceleration in crystal growth. The reaction mechanism was determined in the same manner above by curve fitting. The best fit was obtained with a one-dimensional boundary-controlled reaction model. This suggests oriented growth of crystals along a particular direction.

Figure 4:
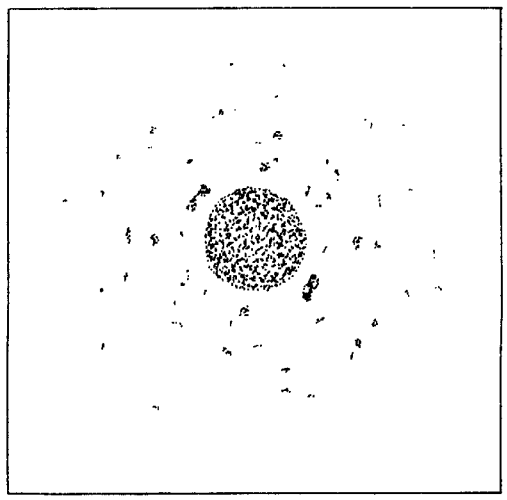
FIG. 4 shows an electron diffraction pattern.

The crystal morphology of the thin film of silicon crystallized with the addition of nickel in trace quantity was subjected to transmission electron microscope (TEM) observation. The TEM observation revealed the characteristic feature of the films deposited with the addition of nickel; the crystal growth in the region into which nickel was added occurs differently from that in the region in vicinity thereof. More specifically, the cross section view of the region into which nickel was added in trace amount shows stripes approximately perpendicular to the substrate. These stripes are assumably a moire pattern or a lattice image. This is an evidence indicating that the crystals initiate their growth from nickel or a compound thereof with silicon provided as the crystal nuclei, and that they form columnar crystals approximately perpendicular to the substrate. When observed from the surface, the columnar crystals in the region into which nickel was added were found to be arranged differently from the case of epitaxial growth; i.e., they were in a less complete ordered arrangement as compared to the epitaxially grown crystals. This can be illustrated more clearly by the transmission electron diffraction (TED) pattern shown in FIG. 4 for the region containing nickel. Referring to FIG. 4, the direction of the incident electron beam is perpendicular to the film plane. The incident electron beam was several micrometers in diameter, and the center spot corresponds to (000). FIG. 4 reads the presence of at least three types of crystals each shifted from each other by a certain angle. Since no ring pattern is observed, the crystals are assumably quite large in size.

The above observation was further confirmed by means of thin film X-ray diffraction (XRD) which was performed in order to determine the crystal orientation. The XRD pattern yielded peaks principally assigned to the form {111} or {110}. The symbol {hkl} denotes collectively all the planes of the form, i.e., all the planes equivalent to the (hkl) plane. Separately, for comparison, thin film XRD was performed on a crystallized thin film silicon of the same thickness but with no addition of nickel. The intensity of the peak assigned to the form {111} in the thin film with the addition of nickel in trace quantity was obviously stronger than that of the peak assigned to the form {110}. This clearly shows that the crystals in the film with the addition of nickel is more oriented than those in the film containing no nickel.

The morphology of the crystals in the vicinity of the region with the addition of nickel is described below. To begin with, the crystallization occurred unexpectedly on the region into which no nickel was added directly. Accordingly, the concentration of nickel was measured by means of secondary ion mass spectroscopy (SIMS) for the region into which nickel was added in trace quantity (sometimes referred to simply hereinafter as "the region of nickel addition"), the region of crystal growth located horizontally in the vicinity of the region of nickel addition (referred to simply hereinafter as "the region of crystal growth"), and the amorphous region located at a distance from the region of nickel addition. The last region remains amorphous because the low temperature crystallization does not take place in the region. The nickel concentration for the region of crystal growth was found to be lower than that for the region of nickel addition by one digit, and that of the amorphous region was observed to be still lower than that of the region of crystal growth by one digit. It can be seen that nickel diffuses over a wide area; hence, the region of crystal growth also undergo low temperature crystallization owing to the presence of nickel in trace quantity.

Figure 6:
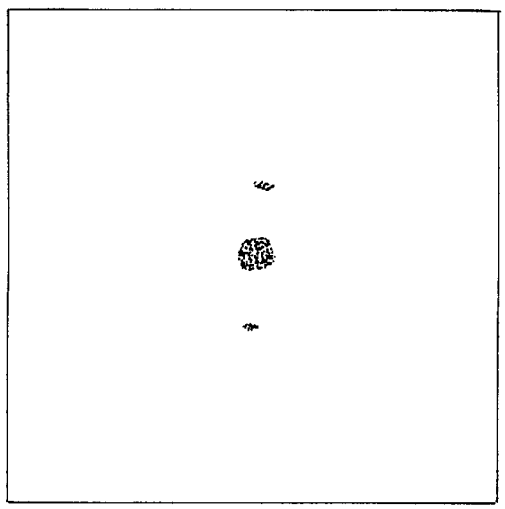
FIG. 6 shows another electron diffraction pattern.
Figure 7:
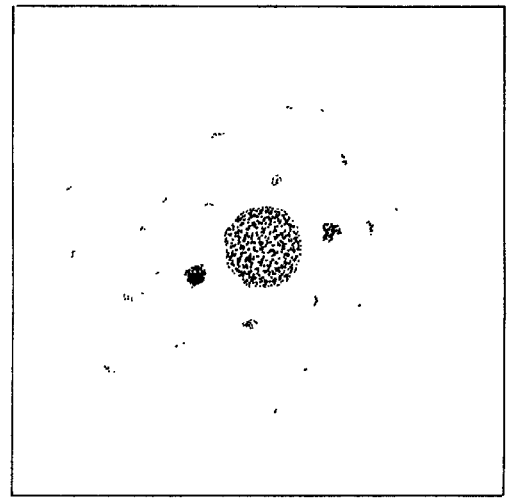
FIG. 7 shows a still other electron diffraction pattern.
Figure 5:
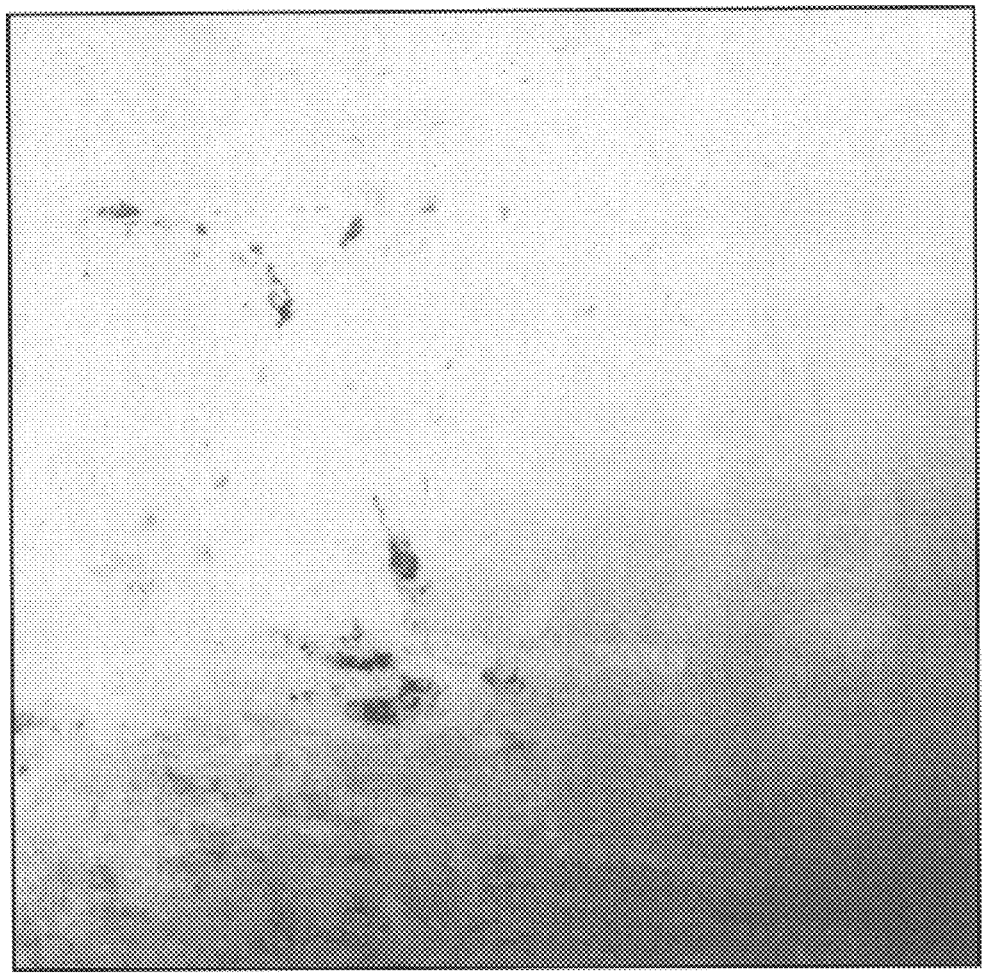
FIG. 5 is a micrograph showing the crystal structure of a silicon film.
Figure 8:
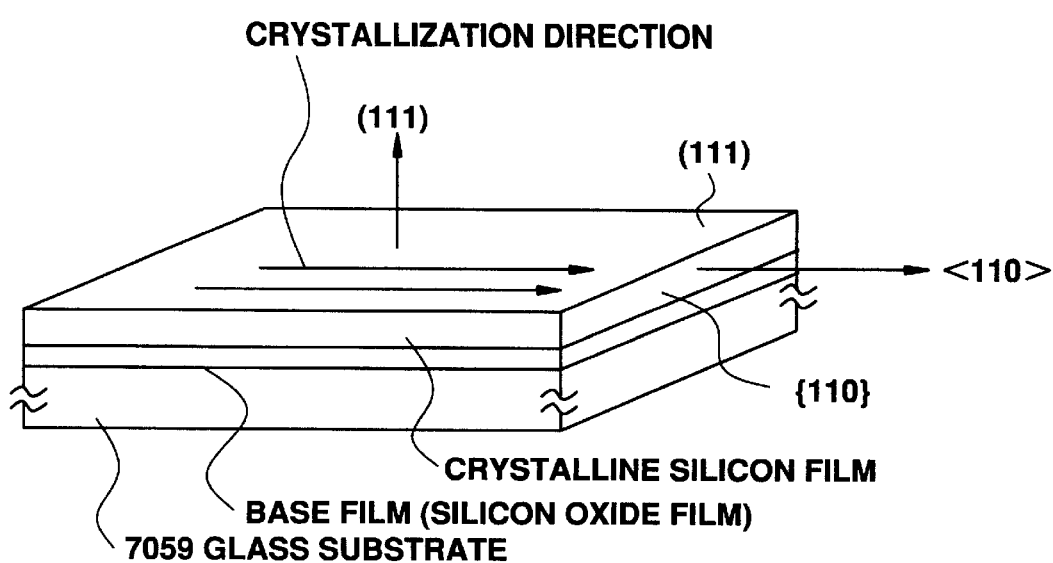
FIG. 8 is a schematically shown crystallographic orientation of a thin film silicon.
Figure 9A:
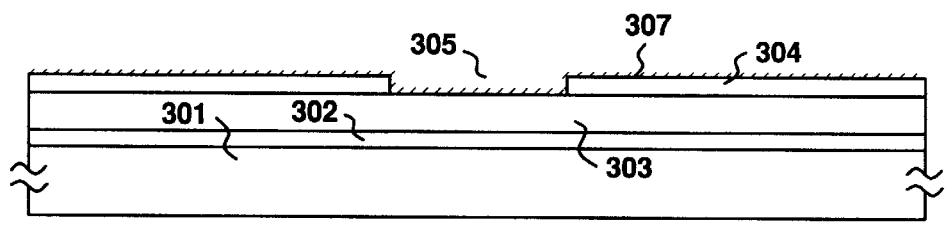
FIGS. 9(A) to 9(E) show schematically drawn step sequential cross section structures obtained in a process according to another embodiment of the present invention.
Figure 9B:
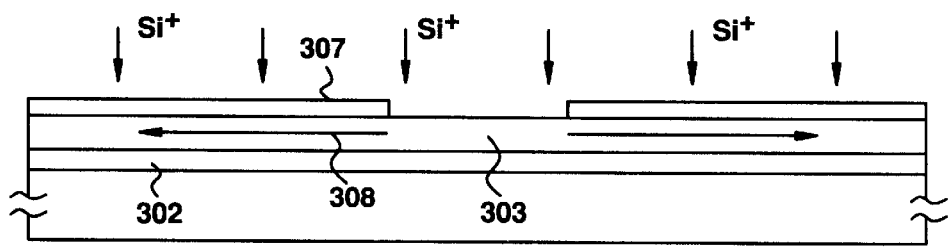
Figure 9C:
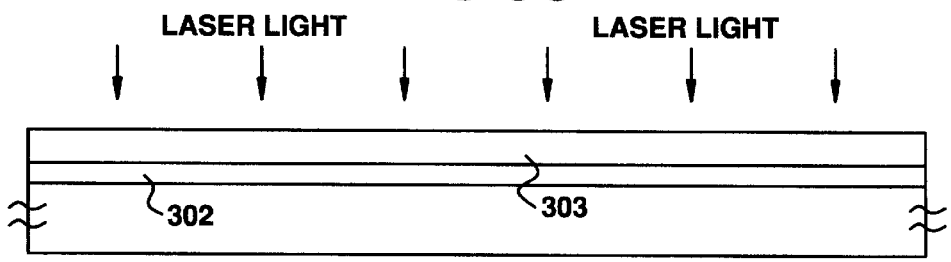
Figure 9D:
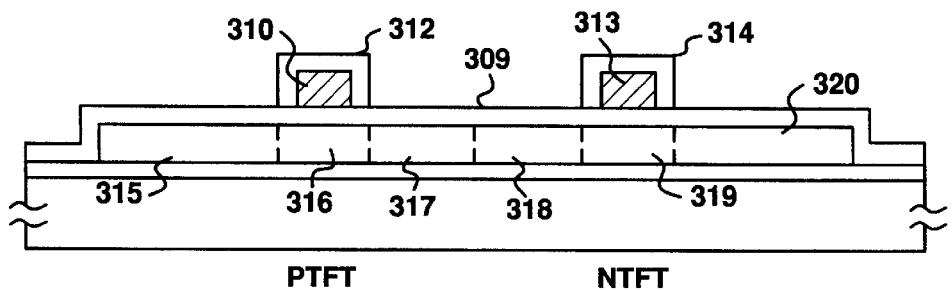
Figure 9E:
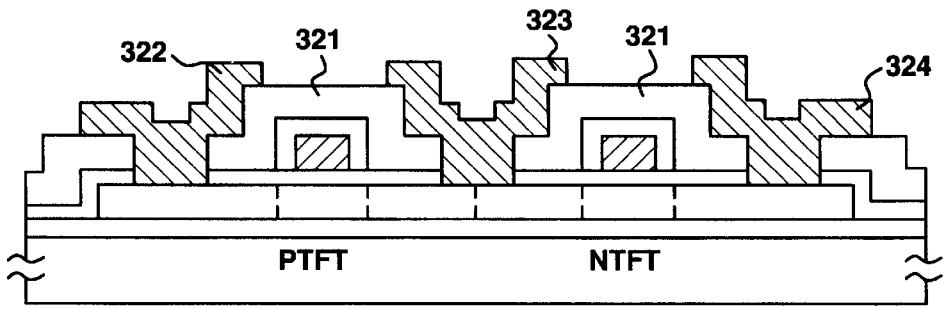

FIG. 5 shows the surface TEM image of the region located in the vicinity of the region of nickel addition. The figure shows that characteristic crystals having an acicular or columnar morphology with uniform width are arranged along a direction in parallel with the substrate. This characteristic crystal growth that occurs along a direction in parallel with the substrate, which is sometimes referred to hereinafter as "transverse crystal growth", is observed to yield crystals grown to a maximum length of several hundreds of micrometers as measured from the region of nickel addition. Furthermore, the growth rate increases proportional to the duration and the temperature. For instance, a crystal growth of about 20 μm was observed within 4 hours at 550° C. The crystals thus obtained were found to cross with each other making an approximately constant angle of about 60° regardless of the location of growth. The TED patterns of the region of crystal growth is shown in FIGS. 6 and 7. FIG. 6 shows a region corresponding to the front end of the acicular crystals, and FIG. 7 shows the region in which the acicular grains are superposed on each other to some extent. It can be seen that very simple TED patterns assigned to single crystals or to twinned crystals are obtained in both. The crystallographic orientation is almost unanimous, and the pattern is in good agreement with the case of [111] incidence. It can be therefore seen that the crystallographic (111) plane is in parallel with the substrate. Since the direction of crystal growth is perpendicular to the [111] direction plane, it can be readily understood that the crystals obtained by transverse crystal growth have their axes in the crystallographic <110> direction. The crystallographic orientation of the crystallized silicon is shown schematically in FIG. 8. The {110} plane or the <110> axis belongs to hexagonal with respect to [110] axis symmetry. Thus, the planes may undergo crystal growth along the <110> axis in such a manner to cross each other making an angle of about 60°. The crystals grown in this manner yield a single-crystal like TED pattern as shown in FIG. 7.

Based on the aforementioned experimental facts, the present inventors propose the possible mechanism of crystallization to be as follows.

In the first step of nucleation, the activation energy is lowered by the addition of nickel in trace amount. This can be seen clearly from the fact that the addition of nickel lowers the temperature of crystallization. Nickel certainly casts effects as an impurity; moreover, it may form an intermetallic compound with silicon to yield a compound having a lattice constant similar to that of crystalline silicon. The effect of the latter can also lower the activation energy. The nucleation occurs simultaneously over the entire region into which nickel is added. Thus, the crystal growth occurs on the whole plane at a time to exhibit a reaction whose rate function, describes a one-dimensional boundary controlled process, and columnar crystals almost perpendicular to the substrate results from such a crystal growth reaction. However, it is impossible to obtain crystals grown with their axes arranged completely in one direction, because of the limited film thickness and of the presence of stress and the like.

In contrast to the case in the direction perpendicular to the substrate, the silicon crystals are homogeneous along the transverse direction. The columnar or acicular crystals grow along the transverse direction from the nuclei, i.e., the region into which nickel is added. The direction of crystal growth coincides approximately with the direction of the crystallographic <110> axis. In this case again, the rate function presumably corresponds to that of a one-dimensional boundary controlled reaction model. As mentioned in the foregoing, the activation energy of crystal growth is lowered due to the addition of nickel, and this fact suggests the growth reaction to proceed at a high rate. The observed results are in good agreement with this assumption. However, the reason for the crystal growth along the <110> direction is yet to be clarified.

The electric properties of the region into which nickel is added in trace amount and of the regions in the vicinity thereof are described below. The electric properties of the region into which nickel is added in trace amount yields an electric conductivity well comparable with that of a film containing no nickel, i.e., a silicon film crystallized at about 600° C. over several tens of hours. The activation energy of crystallization for the film containing nickel was obtained from the temperature dependence of electric conductivity. As a result, no such a behavior attributable to the level of nickel was observed so long as nickel was present in the concentration range of from about $10^{17}$ atoms/cm$^3$ to $10^{18}$ atoms/cm$^3$. It can be seen from the experimental results above that the crystallized silicon films according to the present invention are usable as active layers and the like of a TFT.

In contrast to the above findings in the direction perpendicular to the substrate, the electric conductivity along the transverse direction of the crystallized silicon according to the present invention was found to be higher than that of the nickel-added region by one digit or more. That is, the conductivity of the silicon film along the transverse direction is considerably high as compared with an ordinary crystalline silicon semiconductor. This occurs because the current path matches with the direction of crystal growth along the transverse direction; assumably, almost no grain boundary as to hinder the current flow is present between the electrodes. This assumption is in agreement with the results observed on the transmission electron micrograph. More specifically, the carriers move easily along the grain boundaries of the crystals grown in an acicular or columnar form.

Thus, as mentioned in the foregoing, the present invention increases the mobility of the carriers by approximately matching the direction of the carrier movement inside a semiconductor device (e.g., a TFT) with the grain boundary of the crystallized silicon. The direction along the grain boundary corresponds to the direction of crystal growth of the acicular or columnar crystals which coincides with the direction of the crystallographic <110> axis. Moreover, the electric conductivity along this direction is, as described in the foregoing, higher than any in the other directions (e.g., a direction perpendicular to the direction of crystal growth). However, it is practically impossible to completely match the direction of crystal growth with the movement direction of the carriers. Furthermore, the crystals not always grow uniformly along one direction to cover the entire surface. Thus, in practice, the direction of crystal growth is given as an averaged direction, and so long as it makes an angle of about ±20° with respect to the movement direction of the carriers, the both directions are regarded to be the same.

It is also required in the present invention that the crystalline silicon formed on the substrate is not a single crystal silicon. The crystalline silicon according to the present invention is silicon crystallized in the form of a thin film, and has its direction of crystal growth corresponding to the direction of crystallographic <110> axis. It can be seen therefore that the crystalline silicon according to the present invention is essentially different from a single crystal silicon. Thus, the crystalline silicon film according to the present invention is a thin film of a crystalline non-single crystal silicon.

Taking the above properties into account, the method of applying the crystalline silicon film according to the present invention to a TFT is described below. In the following description, an active-matrix (addressed) liquid crystal device comprising TFTs for driving the pixels is taken as a field to which the TFT is applied.

As described hereinbefore, recent active matrix-type liquid crystal display devices tend to be equipped with large area image displays, and it is essential to prevent shrinking from occurring on glass substrates used in such large area displays. Thus, the process for adding nickel in trace amount into silicon according to the present invention is particularly suitable for crystallizing silicon at a temperature sufficiently lower than the deformation temperature of the glass used as the substrate. The process according to the present invention allows the use of a crystalline silicon in the place of the conventional amorphous silicon by adding nickel in trace amount into silicon and crystallizing silicon at a temperature of from about 500 to 550° C. for a duration of about 4 hours. Needless to say, some modifications must be made on the design rule and the like according to the replacement of amorphous silicon by the crystalline silicon. However, such modifications can be readily coped with by using the conventional apparatuses and processes. Accordingly, great advantages can be obtained by the process according to the present invention when considered as a whole.

In addition to the aforementioned merits, the process according to the present invention enables fabricating two types of TFTs, i.e., a TFT for a pixel and a TFT which constitutes the driver for the peripheral circuit, by taking advantage of the difference in crystal morphology. This is particularly a distinguished advantage in applying the present invention to active matrix-type liquid crystal display devices. In case of the TFTs for use in pixels, a small off current is preferred to so high a mobility. Thus, in the process according to the present invention, nickel is directly added in trace amount to a region designed for the pixel TFTs to allow silicon crystals to grow along the direction perpendicular to the substrate. In this manner, a plurality of grain boundaries can be incorporated along the direction of the channel to lower the off current. Concerning the future application to work stations and the like, the TFTs designed for drivers in the peripheral circuits require a very high mobility. This is in clear contrast to the TFTs for use in the pixels. Thus, in applying the process according to the present invention to the fabrication of those TFTs, nickel is added in trace quantity into the region located in the vicinity of the region corresponding to the TFTs for use in a driver of a peripheral circuit. Then, crystal growth is allowed to proceed along a single direction corresponding to the direction of current path to realize a TFT having a very high mobility.

As described in the foregoing, films of crystalline silicon can be obtained by selectively crystallizing amorphous silicon along a particular direction. Thin films of crystalline silicon having still improved quality can be obtained by irradiating a laser beam or an intense light having an intensity equivalent to that of the laser beam. In this manner, the incompletely crystallized portions remaining in, for example, grain boundaries, can be completely rendered crystalline. Furthermore, the remaining amorphous portion undergoes crystal growth during this step from the nuclei generated in the previous step of heating. Thus, the grain boundaries can be diminished by such a treatment.

Conclusively, a semiconductor device comprising a thin film semiconductor and yet having high mobility can be realized by incorporating a crystalline silicon film composed of acicular or columnar crystals grown along the planar direction of the film and matching the direction of crystal growth approximately with the direction of carrier movement. The path of the carriers can be set in a direction along the grain boundaries, and hence, carriers with high mobility can be realized.

The present invention is illustrated in greater detail referring to non-limiting examples below. It should be understood, however, that the present invention is not to be construed as being limited thereto.

Figure 11:
FIG. 11 is a photograph showing a crystal structure of a terminal portion of crystal growth of a silicon film according to the present invention.
Figure 12:
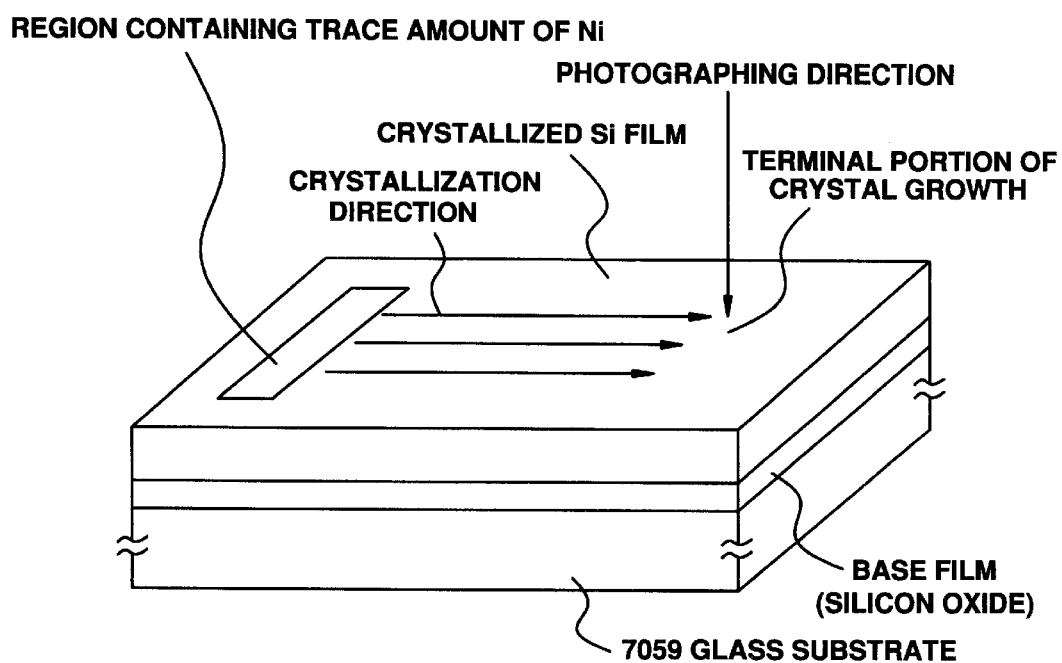
FIG. 12 shows a schematic structure for showing the photographing direction of the photograph of FIG. 11.

FIG. 12 shows a structure for showing the photographing direction of the photograph of FIG. 11, and showing the crystallizing direction of the crystallized silicon film shown in FIG. 11. However, the sample of FIG. 11 for the photographing consists only of the crystallized silicon film obtained by removing the base film and the 7059 glass substrate from the structure shown in FIG. 12 by etching and grinding. The photograph of FIG. 12 is a transmission electron micrograph showing a crystal structure of a terminal portion of the crystal growth of the crystallized silicon film. As shown in FIG. 11, the crystal is grown in the form of column or aciculum from the left hand of FIG. 11 toward the right hand of FIG. 11. The direction of the crystal growth in FIG. 11 coincides approximately with the crystal growth directions (the directions indicated by the arrows) in FIGS. 1 to 3.

EXAMPLE 1

The present example refers to a process according to an embodiment of the present invention; more specifically, it relates to a process for fabricating a circuit comprising a glass substrate formed thereon using crystalline silicon, a P-channel TFT (referred to simply hereinafter as a "PTFT") and an N-channel TFT (referred to simply hereinafter as an "NTFT") combined in a complementary manner. The constitution of the present example can be used as a switching element of pixel electrodes or a peripheral driver circuit of active-type liquid crystal display device, as well as in image sensors and integrated circuits.

Referring to the step sequential structures shown in FIG. 1, the process for fabricating the circuit of the present invention is described below. A 2000 Å thick film of silicon oxide is deposited by sputtering as a base film 102 on a Corning 7059 glass substrate 101. Then, a metal mask or a mask 103 made of silicon oxide and the like is provided thereon. The base film 102 is partly exposed by slitting the mask 103. Thus, when viewed from the upper side, the structure shown in FIG. 1(A) yields a slitted portion among the other portions of the mask to expose the base film 102. After providing the mask 103, a film of nickel silicide expressed by the chemical formula $NiSi_x$ (where x is in the range of from 0.4 to 2.5; specifically, for example, 2.0), is deposited by sputtering at a thickness of from 5 to 200 Å, for example, 20 Å, selectively on a particular region 100.

Then, a film of an intrinsic (I-type) amorphous silicon film 104 is deposited by plasma-assisted CVD to a thickness of from 500 to 1,500 Å, for example, 1,000 Å. The amorphous silicon film thus deposited is annealed for 4 hours at 550° C. under a reducing atmosphere of hydrogen (preferably, at a hydrogen partial pressure of from 0.1 to 1 atm) or in an inert gas atmosphere (at the atmospheric pressure). Within the thus crystallized silicon film, the crystallization of the crystalline silicon film 104 occurs along a direction perpendicular to the substrate 101 in the region 100 formed selectively thereon a nickel silicide film. In the region other than the selective region 100, the crystal growth occurs from the region 100 and along the transverse direction (the direction in parallel with the substrate) as indicated with an arrow 105.

Thus, a film of crystalline silicon 104 can be obtained by crystallizing an amorphous silicon film. Then, a 1,000 Å thick film of silicon oxide 106 as a gate insulating film is deposited by sputtering. The sputtering process is effected using silicon oxide as the target, while maintaining the substrate temperature in the range of from 200 to 400° C., for example, 350° C., under an atmosphere of mixed gas comprising argon and oxygen at an argon to oxygen ratio of from 0 to 0.5, for example, at a ratio of 0.1 or lower. Subsequently, an aluminum film containing from 0.1 to 2% silicon is deposited by sputtering to a thickness of from 6,000 to 8,000 Å, for example, to a thickness of 2,000 Å. The film deposition steps for the silicon oxide film 106 and the aluminum film are preferably effected continuously.

The silicon film 104 is patterned and gate electrodes 107 and 109 are formed. The surface of the aluminum electrode is subjected to anodic oxidation thereafter to form oxide layers 108 and 110 each 200 Å in thickness. The anodic oxidation is effected in an ethylene glycol solution containing from 1 to 5% tartaric acid. Since the thickness of the oxide layer corresponds to the thickness of off-set gate region, the length of the off-set region can be set previously in the step of anodic oxidation.

Then, by ion doping, impurities are added into the active region (which later provides source/drain and channel) to render the active region either N-conductive or P-conductive. The doping step comprises implanting impurities (phosphorus and boron) into the active region using the gate electrode 107 and the oxide layer 108 surrounding the gate electrode, and the gate electrode 109 and the surrounding oxide layer 110 as the mask. Phosphine ($PH_3$) and diborane ($B_2H_6$) are used as the doping gas. In case of using phosphine, doping of phosphorus is effected at an accelerating voltage of from 60 to 90 kV, specifically for example, at 80 kV, and at a dose of from $1 \times 10^{15}$ to $8 \times 10^{15}$ $cm^{-2}$, for example, $2 \times 10^{15}$ $cm^{-2}$. In case of using diborane, doping of boron is effected at an accelerating voltage of from 40 to 80 kV, specifically for example, at 65 kV, and at a dose in the same range as in case of phosphorus, but specifically, at a dose of $5 \times 10^{15}$ $cm^{-2}$. In effecting doping, phosphorus and boron are each introduced selectively in the predetermined regions by covering the other regions with a photoresist. Thus, N-type impurity regions 114 and 116, P-type impurity regions 111 and 113 are obtained as a result to form the region of a P-channel TFT (PTFT) and the region of an N-channel TFT (NTFT).

Annealing is effected thereafter by irradiating a laser beam. In the present example, a KrF excimer laser operated at a wavelength of 248 nm and at a pulse width of 29 nsec is used, however, the type of laser is not only limited thereto. The laser irradiation is effected at an energy density of 200 to 400 $mJ/cm^2$, for example, at 250 $mJ/cm^2$, and by applying from 2 to 10 shots, specifically, 2 shots, per site. It is effective to heat the substrate during the laser beam irradiation to maintain the substrate temperature in the range of from about 200 to 450° C. In the step of laser annealing, the previously crystallized region easily undergoes recrystallization because it contains nickel diffused therein. The laser annealing also activates the impurity regions 111 and 113 rendered P-type conductive by the doped impurity, as well as the impurity regions 114 and 116 rendered N-type conductive by the doped impurity.

A 6,000 Å thick silicon oxide film 118 is deposited by plasma CVD thereafter to provide an inter layer insulation. Contact holes are provided therein to form an electrode and interconnection 117, 120, and 119 using a metallic material, for instance, a multilayered film of titanium nitride and aluminum. Finally, the entire structure is annealed at 350° C. under a hydrogen atmosphere of 1 atm for a duration of 30 minutes to obtain a semiconductor circuit comprising TFTs in complementary constitution as shown in FIG. 1 (D).

The CMOS structured circuit thus obtained comprises a PTFT and an NTFT provided in a complementary arrangement, however, it is also possible to fabricate two independent TFTs by forming two TFTs simultaneously according to the process steps above, and separating them at the center.

Figure 2:
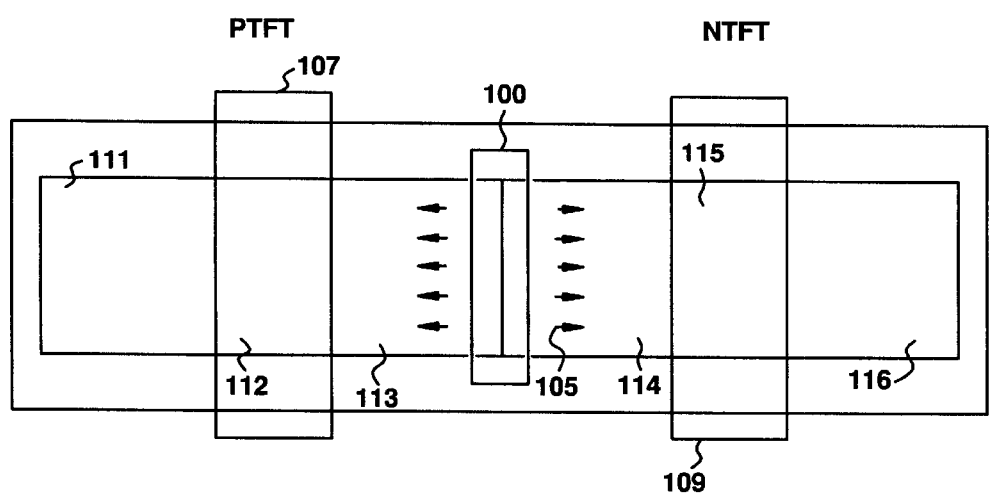
FIG. 2 shows the schematically drawn structure of a semiconductor device according to an embodiment of the present invention.
Figure 3A:
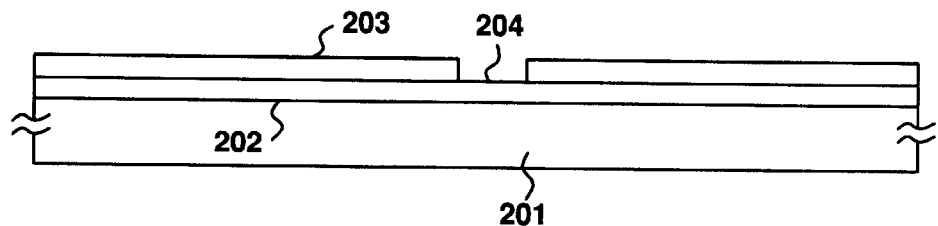
FIGS. 3(A) to 3(D) show the schematically drawn structures of a semiconductor device according to another embodiment of the present invention.
Figure 3B:
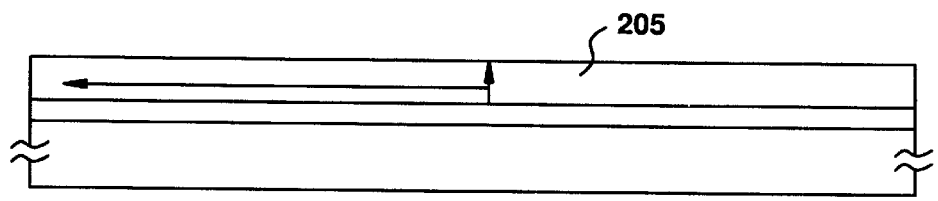
Figure 3C:
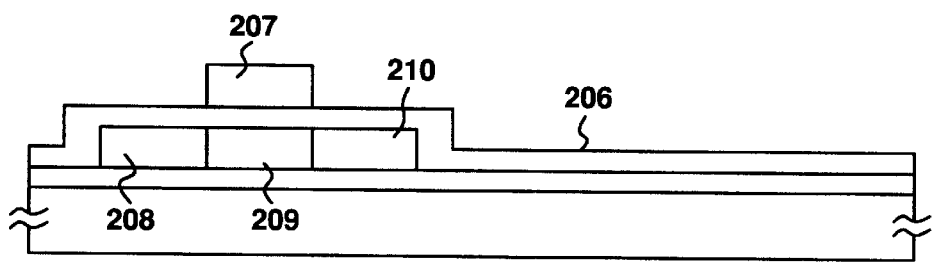
Figure 3D:
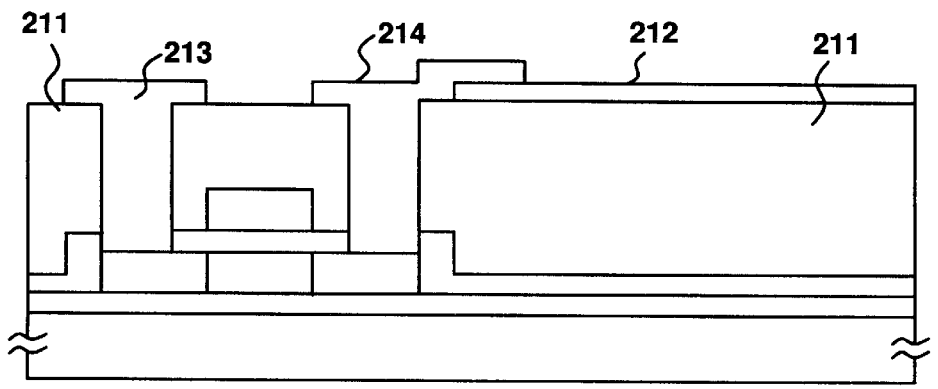

FIG. 2 schematically shows the upper view of the structure given in FIG. 1 (D). The symbols in FIG. 2 corresponds to those in FIG. 1. Referring to FIG. 2, the direction of crystallization is indicated with arrows. It can be seen therefrom that the crystal growth occurs along the direction corresponding to a line tying the source region and the drain region. During the operation, the carriers in the TFTs move between the source and the drain along the direction of growth of the acicular or columnar crystals. In other words, the carriers move along the grain boundaries of the acicular or the columnar crystals. Accordingly, TFTs with higher mobility can be implemented by thus reducing the resistance against the movement of the carriers, thereby allowing the carriers to move more freely between the source and the drain.

In the present example, nickel is introduced by selectively forming a thin film of nickel (though not observed as a film because of its extremely small thickness) on the base film 102 located under the thin film 104 of amorphous silicon. However, nickel can be introduced otherwise by selectively depositing a nickel silicide film after forming the amorphous silicon film. In short, the crystals can be grown from either the upper side or the lower side of the amorphous silicon film. Otherwise, nickel ions can be selectively implanted into a previously deposited amorphous silicon film 104. The last case is advantageous in that the concentration of nickel can be readily controlled.

EXAMPLE 2

The present example relates to an active-matrix type liquid crystal display device having N-channel TFTs (NTFTs) each attached as a switching element to each of the pixels. The following description refers to a single pixel, however, a practical active-matrix type liquid crystal device comprises a great number (generally several hundred thousands) of pixels all having the same structure. Furthermore, the TFT not necessarily be an NTFT, and a PTFT can be employed as well. The TFT need not be provided to the pixel portion of the liquid crystal display, and it can be used in the peripheral circuits. Moreover, it can be used in image sensors and in other devices. In short, the application is not limited as long as it is used as a thin film transistor.

Referring to the step sequential structures shown in FIG. 3, the process for fabricating the structure according to an embodiment of the present invention is described below. A 2000 Å thick film of silicon oxide is deposited by sputtering as a base film 202 on a Corning 7059 glass substrate 201 having a thickness of 1.1 mm and an area of 300×400 $mm^2$. Then, a metal mask or a mask 203 made of a silicon oxide film, a photoresist, or the like is provided thereon. After providing the mask 203, a film of nickel silicide expressed by the chemical formula $NiSi_x$ (where x is in the range of from 0.4 to 2.5; specifically, for example, 2.0), is deposited on a selected region 204 by sputtering at a thickness of from 5 to 200 Å, for example, 20 Å.

A 1,000 Å thick film 205 of amorphous silicon is deposited thereafter by LPCVD or plasma-assisted CVD. The amorphous silicon film thus deposited is subjected to dehydrogenation at 400° C. for a duration of one hour, and annealed by heating. The annealing is effected in a reducing atmosphere of hydrogen (preferably under a hydrogen partial pressure of from 0.1 to 1 atm) at 550° C. for 4 hours. The annealing step can be effected under an atmosphere of an inert gas such as of nitrogen.

The crystallization of the amorphous silicon film 205 is initiated from a particular part having a nickel silicide film thereunder. Referring to FIG. 3 (B), the silicon crystals on the portion 204 having a nickel silicide film thereunder grow along a direction perpendicular to the substrate 201 during the crystallization. Similarly, as indicated with an arrow, the silicon crystals grow along a direction in parallel with the substrate in regions having no films of nickel silicide, i.e., the regions other than the particular region 204.

After forming the semiconductor film 205 made of crystalline silicon in this manner, an island-like semiconductor region (the active layer of TFT) is provided by patterning the semiconductor film 205. A silicon oxide gate insulating film 206 is formed thereafter at a thickness of from 70 to 120 nm, typically at a thickness of 100 nm, by means of plasma-assisted CVD in oxygen atmosphere using tetraethoxysilane (TEOS) as the starting material. The substrate is maintained at a temperature of 400° C. or lower, and preferably, in the temperature range of from 200 to 350° C.

A known film containing silicon as the principal component is deposited thereafter by means of CVD, and patterned to form a gate electrode 207. Then, phosphorus is implanted as an impurity by ion doping to form a source region 208, a channel-forming region 209, and a drain region 210 in a self-aligned manner. Then, a laser beam is irradiated using a KrF laser to the silicon film subjected to ion doping to recover its crystallinity from the damaged state. The laser is operated in this case at an energy density of from 250 to 300 mJ/cm$^2$. The sheet resistance of the source/drain of the TFT is found to be in the range of from 300 to 800 $\Omega$/cm$^2$ after subjecting the TFT to laser irradiation.

An inter layer insulation 211 is formed thereafter using silicon oxide, and a pixel electrode 212 is provided using ITO (indium tin oxide). Then, contact holes are perforated to form electrodes 213 and 214 in the source/drain regions of the TFT using a multilayered film composed of chromium and aluminum. One of the electrodes, the electrode 213, is connected with an ITO film 121. Finally, the structure is annealed in hydrogen for 2 hours at a temperature in, the range of from 200 to 300° C. to completely hydrogenate silicon. Thus is implemented a complete TFT. This step is effected simultaneously on all of the other pixel regions provided in large number.

The TFT fabricated in the present example is characterized in that the active layer which provides the source region, the channel-forming region, and the drain region of the TFT is made of a crystalline silicon film composed of crystals grown along the direction of carrier movement. Thus, the carriers can move along the grain boundaries of the acicular or columnar crystals without being hindered by the grain boundaries. This leads to a TFT having extremely high mobility. The TFT thus obtained according to the present example was of an N-channel type, and was found to have a mobility of from 90 to 130 (cm$^2$/Vs). The mobility of the conventional NTFTs using crystalline silicon films obtained after thermal annealing at 600° C. for a duration of 48 hours is in the range of from 80 to 100 (cm$^2$/Vs). By simply comparing those values of mobility, it can be seen that the TFT according to the present invention is far improved in mobility as compared with a conventional TFT.

A P-channel TFT (PTFT) was fabricated by a process similar to that employed in fabricating the NTFT. The mobility was obtained in the range of from 50 to 80 (cm$^2$/Vs). This value is in clear contrast with the mobility of from 30 to 60 (cm$^2$/Vs) for a PTFT using a conventional crystalline silicon film obtained by thermal annealing at 600° C. for a duration of 48 hours. Thus, the present invention provides PTFTs considerably improved in mobility as compared with the conventional ones.

EXAMPLE 3

The present example provides a TFT similar to that described in Example 2, except for providing a source/drain along a direction perpendicular to that of crystal growth. Thus, the direction of carrier movement is arranged perpendicular to the direction of crystal growth, and hence, carriers must move in such a manner to cross the grain boundaries of the acicular or columnar crystals. The resistance between the source and the drain can be set higher by taking such a constitution, because the carriers must cross the grain boundaries of the crystals grown in an acicular or columnar form. Thus, the constitution according to the present example can be implemented in accordance with the constitution described in Example 2, and then simply determining the setting direction of the TFT.

EXAMPLE 4

The present example relates to a method of selectively controlling the TFT characteristics by setting the direction of assembling the TFT at a desired angle to the direction of crystal growth in the crystalline silicon film taken with respect to the surface of the substrate. The term "direction of assembling the TFT" as referred herein is defined as the direction of the line connecting the source and the drain regions; that is, the direction of carrier movement.

As described in the foregoing, the mobility of the carriers can be increased by allowing the carriers to move along the direction of crystal growth, because the carriers can move along the grain boundaries. In moving the carriers along a direction perpendicular to the direction of crystal growth, on the contrary, the mobility lowers because the carriers must cross a number of grain boundaries.

Taking the aforementioned two extremes into account, it is possible to control the carrier mobility by setting the direction of carrier movement with respect to the direction of crystal growth at an angle in the range of from 0 to 90°. From a different point of view, moreover, the resistance between the source and the drain regions also can be controlled by setting the angle of carrier movement with respect to the direction of crystal growth. As a matter of course, this constitution is readily applicable to that described in Example 1. Referring to FIG. 2, the slit region 100 for adding nickel in trace quantity rotates at an angle in the range of from 0 to 90° to select an angle of from 0 to 90° between the direction of crystal growth (the direction indicated by arrows 105) and the direction of the line connecting the source and the drain regions. When the angle selected is closer to 0 °, a high mobility is realized and a constitution having low electric resistance between the source and the drain can be implemented; when the angle approaches 90°, the mobility decreases and the resistance between the source and the drain is maximized.

EXAMPLE 5

Referring to FIG. 9, a process for fabricating an inverter circuit comprising an NTFT and a PTFT according to an embodiment of the present invention is described below. A film of silicon oxide 302 is formed on a glass substrate 301 at a thickness of from 1,000 to 5,000 Å, more specifically, 2,000 Å, for example. Subsequently, a-film of amorphous silicon 303 is deposited by plasma-assisted CVD thereon at a thickness of from 300 to 1,500 Å, more specifically for example, at a thickness of 500 Å. Further, a silicon oxide film 304 is formed thereon at a thickness of from 500 to 1,500 Å, for example, at a thickness of 500 Å. These films are preferably provided sequentially one after another. The silicon oxide film 304 is then selectively etched to provide a window 305 to introduce nickel therethrough. The window 305 is formed at portions other than those corresponding to the channel of the TFT.

A film 307 of a nickel salt is formed thereafter by spin coating. More specifically, nickel acetate or nickel nitrate is diluted with water or ethanol to obtain a solution containing the nickel salt at a concentration of from 25 to 200 ppm, for example, at a concentration of 100 ppm, and used in the spin coating.

An extremely thin silicon oxide film is formed on the exposed portion (the region corresponding to the window 305) of the amorphous silicon film by immersing the substrate into hydrogen peroxide or a mixed solution of hydrogen peroxide and ammonia. This extremely thin film is provided to improve the affinity of the nickel solution thus prepared with the boundary of: the amorphous silicon film.

The substrate subjected to the treatment above is then set on a spinner and rotated mildly while dropping the nickel solution in a quantity of from 1 to 10 ml, specifically 2 ml, for example, to extend the solution over the entire surface of the substrate. This state is maintained thereafter for a duration of from 1 to 10 minutes, for example, for 5 minutes. The rate of revolution of the substrate is then increased to effect spin drying. This operation can be repeated for a plurality of times. Thus is obtained a thin film 307 of a nickel salt as illustrated in FIG. 9 (A).

Silicon ions are implanted thereafter by ion implantation. In the region covered with the silicon oxide film 304, the ion implantation is effected in such a manner that maximum amount of ions might be incorporated at the boundary between the amorphous silicon film 303 and the silicon oxide film 302 provided as the base film. Particularly in this case, silicon ions are more deeply implanted into the region of the window 305, because there is no film of silicon oxide 304.

Then, heat treatment is effected in the heating furnace in the temperature range of from 520 to 580° C. for a duration of from 4 to 12 hours, for example, at 550° C. for 8 hours, under a nitrogen gas atmosphere. As a result, nickel is found to diffuse into the region just under the window 305, and the crystallization is observed to initiate from this region. The region of crystallization is found to extend to the periphery thereof as indicated with an arrow 308 in FIG. 9 (B).

Then, the crystallinity of the thus annealed film is further improved by irradiating a laser beam for 1 to 20 shots, 5 shots for example, under the atmospheric condition or in oxygen atmosphere using a KrF excimer laser operated at a wavelength of 248 nm or a XeCl excimer laser operated at a wavelength of 308 nm. The laser beam treatment is performed at an energy density of from 200 to 350 mJ/cm$^2$ while maintaining the substrate temperature in the range of from 200 to 400° C. This step is illustrated in FIG. 9 (C).

The silicon film 303 is etched thereafter to establish the region for TFT. Then, a silicon oxide film 309 is formed over the entire surface at a thickness of from 1,000 to 1,500 Å, specifically 1,200 Å for example, and an aluminum gate electrode 310 for the PTFT and an aluminum gate electrode 313 for the NTFT are formed, in the same manner as in the process described in Example 1. Furthermore, gate electrode portions 312 and 314 are formed using the anodic oxide films of each of the aluminum gate electrodes.

Then, by using the gate electrode portions as the mask, an N-type and a P-type impurity are implanted by ion doping into the silicon film in the same manner as in Example 1. Thus are obtained a source 315, a channel 316, and a drain 317 for the PTFT, and a source 320, a channel 319, and a drain 318 for the peripheral circuit NTFT. Laser beam is irradiated thereafter over the entire surface in the same manner as in the process of Example 1 to activate the doped impurities. The resulting structure is shown in FIG. 9 (D).

A film of silicon oxide 321 is deposited thereafter as an inter layer insulation at a thickness of from 3,000 to 8,000 Å, for example, at a thickness of 5,000 Å. A contact hole is formed thereafter in the source and the drain of the TFT. Then, a double layered film of titanium nitride (1,000 Å in thickness) and aluminum (5,000 Å in thickness) is deposited for patterning and etching to obtain electrodes with interconnections 322 to 324. Thus is obtained an inverter circuit comprising a PTFT and an NTFT from crystalline silicon grown along a transverse direction as shown in FIG. 9 (E).

The direction of carrier movement is the same as that in the circuit fabricated according to the process of Example 1. More specifically, the direction of crystallization 308 in the present example coincides with that of carrier movement (i.e., the direction of the line tying the source and the drain). Thus, the inverter circuit according to the present example yields a high drain current suitable for high speed operation. Furthermore, the process according to the present example comprises a step of laser irradiation treatment as shown in FIG. 9 (C). Thus, the amorphous portion remaining between the acicular silicon crystals undergo crystallization in such a manner to increase the diameter of the acicular crystals. This increases the area of current flow to further afford a large amount of drain current.

Figure 10A:
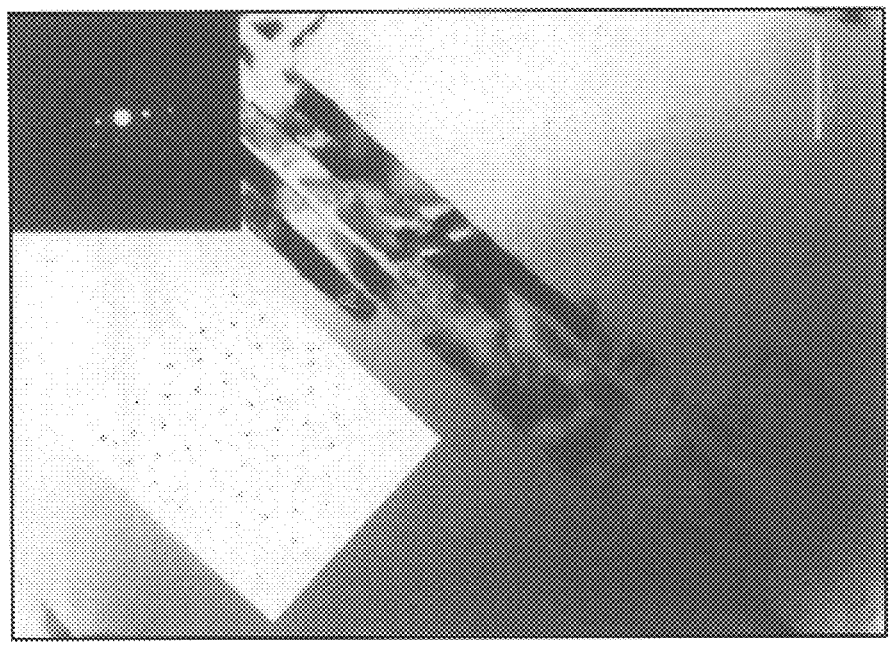
FIGS. 10(A) and 10(B) are photographs showing the crystal structure of a thin film silicon obtained according to an embodiment of the present invention.
Figure 10B:
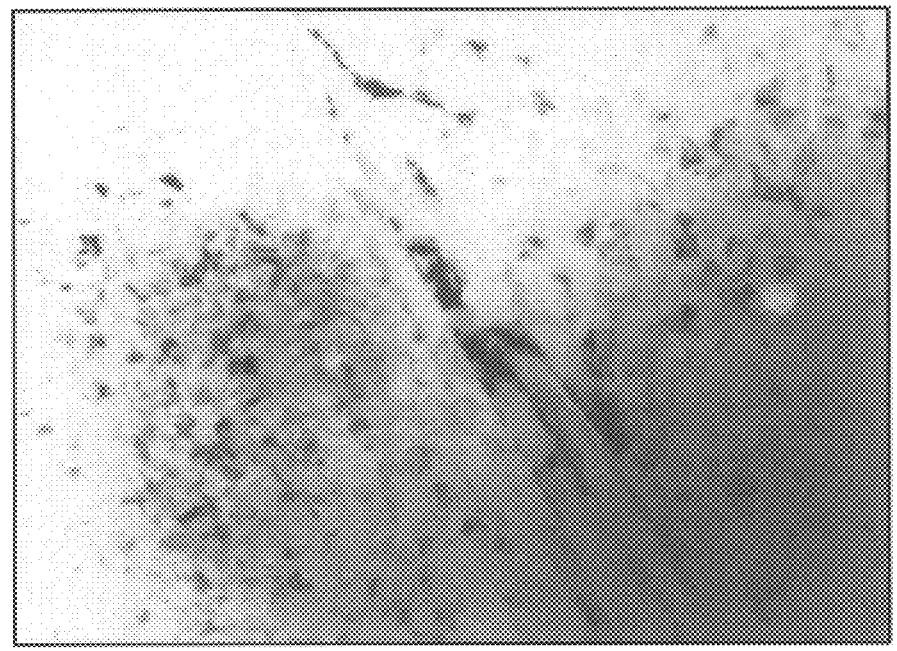

The phenomena above can be confirmed by referring to FIG. 10. FIG. 10 is a transmission electron micrograph taken on a thin film of crystallized silicon film. FIG. 10 (A) shows the front edge (the terminal edge) of the crystallizing region of a silicon film crystallized along the transverse direction. Acicular crystals can be observed, and quite a large number of amorphous regions remain between the crystals (FIG. 10 (A)).

These amorphous regions crystallize upon irradiating a laser beam under the conditions according to the present invention. The resulting structure is shown in FIG. 10 (B). The amorphous region accounting for a large area of the silicon film undergoes crystallization in this manner, however, the resulting crystals do not yield sufficiently high electric properties, because the crystallization occurs randomly. The most noticeable is the crystalline state of the portions located between the acicular crystals at the central region. Assumably, these portions are initially amorphous, but crystals form and grow from the acicular crystals to turn these portions into a thick crystalline region as shown in FIG. 10 (B).

To make the change more readily understandable, FIG. 10 gives the micrograph of the front edge (the terminal edge) of the silicon film in which the amorphous region is present at a relatively large fraction. However, the crystallization occurs in the same manner in the center portions and the bottom portions of the crystals. The TFT characteristics can be further improved in this manner by irradiating a laser beam to reduce the amorphous portions and thereby thickening the acicular crystals.

As described in detail in the foregoing, the present invention provides a TFT comprising a film of a crystalline non-single crystal silicon semiconductor composed of crystals grown along a direction in parallel with the surface of the substrate, provided that the direction of the carrier movement inside the TFT is controlled as such that it may coincide with the direction of the crystal growth. In this manner, the carriers are allowed to move along the grain boundary of the crystals grown into an acicular or columnar form, and a TFT having a high mobility can be realized.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
   a crystalline semiconductor film formed over a substrate having an insulating surface, said semiconductor film having at least source, drain and channel regions; and
   a gate electrode adjacent to said channel region with a gate insulating film interposed therebetween,
   wherein crystals of said semiconductor film extend horizontally in <110> direction, an axis of one of said crystals intersects with an axis of another one of said crystals at a constant angle.

2. A device according to claim 1 wherein said constant angle is about 60.

3. A device according to claim 1 wherein crystallographic orientation of said crystalline semiconductor film is (111) plane.

4. A device according to claim 1 wherein said semiconductor film contains a catalyst for promoting crystallization of said semiconductor film.

5. A device according to claim 4 wherein a concentration of said catalyst in said semiconductor film is not higher than $1\times10^{19}$ atoms/cm$^3$.

6. A device according to claim 1 wherein said crystalline semiconductor film has a single-crystal like transmission electron diffraction (TED) pattern.

7. A device according to claim 1 wherein said semiconductor device is an active matrix type display device.

8. A device according to claim 1 wherein the gate electrode is located over the channel region.

9. A device according to claim 1 wherein the semiconductor device has an image sensor.

10. A semiconductor device comprising:
    a crystalline semiconductor film formed over a substrate having an insulating surface, said crystalline semiconductor film having at least source, drain and channel regions; and
    a gate electrode adjacent to said channel region with a gate insulating film interposed therebetween,
    wherein said crystalline semiconductor film comprises a plurality of crystals extending in a direction perpendicular to [111] direction, and
    wherein an axis of one of said crystals intersects with an axis of another one of said crystals at a constant angle.

11. A device according to claim 10 wherein said constant angle is about 60°.

12. A device according to claim 10 wherein a crystallographic orientation of said crystalline semiconductor film is (111) plane.

13. A device according to claim 10 wherein said semiconductor film contains a catalyst for promoting crystallization of said semiconductor film.

14. A device according to claim 13 wherein a concentration of said catalyst in said semiconductor film is not higher than $1\times10^{19}$ atoms/cm$^3$.

15. A device according to claim 10 wherein said crystalline semiconductor film has a single-crystal like transmission electron diffraction (TED) pattern.

16. A device according to claim 10 wherein said semiconductor device is an active matrix type display device.

17. A device according to claim 10 wherein the gate electrode is located over the channel region.

18. A device according to claim 10 wherein the semiconductor device has an image sensor.

19. A semiconductor device comprising:
    a crystalline semiconductor film formed over a substrate having an insulating surface, said crystalline semiconductor film having at least source, drain and channel regions; and
    a gate electrode adjacent to said channel region with a gate insulating film interposed therebetween,
    wherein said crystalline semiconductor film comprises crystals extending horizontally with respect to said insulating surface, an axis of said crystals extending has hexagonal symmetry with respect to [111] direction, and
    wherein an axis of one of said crystals intersects with an axis of another one of said crystals at a constant angle.

20. A device according to claim 19 wherein said constant angle is about 60°.

21. A device according to claim 19 wherein said crystalline semiconductor film is an intrinsic type.

22. A device according to claim 19 wherein said crystalline semiconductor film has a thickness not larger than 1500 Å.

23. A device according to claim 19 wherein said crystalline semiconductor film contains a catalyst for promoting crystallization of said semiconductor film.

24. A device according to claim 19 wherein a concentration of said catalyst in said crystalline semiconductor film is not higher than $1\times10^{19}$ atoms/cm$^3$.

25. A device according to claim 19 wherein said substrate is a glass substrate having an insulating film formed thereon.

26. A device according to claim 19 wherein said semiconductor device is an active matrix type display device.

27. A device according to claim 19 wherein the gate electrode is located over the channel region.

28. A device according to claim 19 wherein the semiconductor device has an image sensor.

29. A semiconductor device comprising:
    a crystalline semiconductor film formed over a substrate having an insulating surface, said semiconductor film having at least source, drain and channel regions; and
    a gate electrode adjacent to said channel region with a gate insulating film interposed therebetween,
    wherein said crystalline semiconductor film comprises crystals extending horizontally with respect to said insulating surface, an axis of one of said crystals intersects with an axis of another one of said crystals at a constant angle.

30. A device according to claim 29 wherein said constant angle is about 60°.

31. A device according to claim 29 wherein a crystallographic orientation of said crystalline semiconductor film is (111) plane.

32. A device according to claim 29 wherein said semiconductor film contains a catalyst for promoting crystallization of said semiconductor film.

33. A device according to claim 32 wherein a concentration of said catalyst in said semiconductor film is not higher than $1\times10^{19}$ atoms/cm$^3$.

34. A device according to claim 29 wherein said semiconductor film has a thickness not larger than 1500 Å.

35. A device according to claim 29 wherein said substrate is a glass substrate having a base film formed thereon.

36. A device according to claim 29 wherein said semiconductor device is an active matrix type display device.

37. A device according to claim 29 wherein the gate electrode is located over the channel region.

38. A device according to claim 29 wherein the semiconductor device has an image sensor.

39. A semiconductor device comprising:
- a crystalline semiconductor film formed over a substrate having an insulating surface, said semiconductor film having at least source, drain and channel regions,
- wherein crystals of said semiconductor film extend in <110> direction and an axis of one of said crystals intersects with an axis of another one of said crystals at a constant angle.

40. A device according to claim 39 wherein said constant angle is about 60°.

41. A device according to claim 39 wherein said semiconductor film contains a catalyst for promoting crystallization of said semiconductor film.

42. A device according to claim 41 wherein a concentration of said catalyst in said semiconductor film is not higher than $1\times10^{19}$ atoms/cm$^3$.

43. A device according to claim 39 wherein said crystalline semiconductor film has a single-crystal like transmission electron diffraction (TED) pattern.

44. A device according to claim 39 wherein said semiconductor device is an active matrix type display device.

45. A device according to claim 39 wherein the semiconductor device has an image sensor.

46. A semiconductor device comprising:
- a crystalline semiconductor film formed over a substrate having an insulating surface, said crystalline semiconductor film having at least source, drain and channel regions,
- wherein said crystalline semiconductor film comprises a plurality of crystals extending in a direction perpendicular to (111) direction, and
- wherein an axis of one of said crystals intersects with an axis of another one of said crystals at a constant angle.

47. A device according to claim 46 wherein said constant angle is about 60°.

48. A device according to claim 46 wherein said semiconductor film contains a catalyst for promoting crystallization of said semiconductor film.

49. A device according to claim 48 wherein a concentration of said catalyst in said semiconductor film is not higher than $1\times10^{19}$ atoms/cm$^3$.

50. A device according to claim 46 wherein said crystalline semiconductor film has a single-crystal like transmission electron diffraction (TED) pattern.

51. A device according to claim 46 wherein said semiconductor device is an active matrix type display device.

52. A device according to claim 46 wherein the semiconductor device has an image sensor.

53. A semiconductor device comprising:
- a crystalline semiconductor film formed over a substrate having an insulating surface, said crystalline semiconductor film having at least source, drain and channel regions,
- wherein said crystalline semiconductor film comprises crystals, an axis of said crystals having hexagonal symmetry with respect to (111) direction, and
- wherein an axis of one of said crystals intersects with an axis of another one of said crystals at a constant angle.

54. A device according to claim 53 wherein said constant angle is about 60°.

55. A device according to claim 53 wherein said crystalline semiconductor film is an intrinsic type.

56. A device according to claim 53 wherein said crystalline semiconductor film has a thickness not larger than 1500 Å.

57. A device according to claim 53 wherein said crystalline semiconductor film contains a catalyst for promoting crystallization of said semiconductor film.

58. A device according to claim 57 wherein a concentration of said catalyst in said crystalline semiconductor film is not higher than $1\times10^{19}$ atoms/cm$^3$.

59. A device according to claim 53 wherein said substrate is a glass substrate having an insulating film formed thereon.

60. A device according to claim 53 wherein said semiconductor device is an active matrix type display device.

61. A device according to claim 53 wherein the semiconductor device has an image sensor.

62. A semiconductor device comprising:
- a crystalline semiconductor film formed over a substrate having an insulating surface, said semiconductor film having at least source, drain and channel regions,
- wherein said crystalline semiconductor film comprises crystals, an axis of one of said crystals intersects with an axis of another one of said crystals at a constant angle.

63. A device according to claim 62 wherein said constant angle is about 60°.

64. A device according to claim 62 wherein a crystallographic orientation of said crystalline semiconductor film is (111) plane.

65. A device according to claim 62 wherein said semiconductor film contains a catalyst for promoting crystallization of said semiconductor film.

66. A device according to claim 65 wherein a concentration of said catalyst in said semiconductor film is not higher than $1\times10^{19}$ atoms/cm$^3$.

67. A device according to claim 62 wherein said semiconductor film has a thickness not larger than 1500 Å.

68. A device according to claim 62 wherein said substrate is a glass substrate having a base film formed thereon.

69. A device according to claim 62 wherein said semiconductor device is an active matrix type display device.

70. A device according to claim 62 wherein the semiconductor device has an image sensor.

71. A semiconductor device comprising:
- a crystalline semiconductor film formed over a substrate having an insulating surface, said semiconductor film having at least source, drain and channel regions,
- wherein said crystalline semiconductor film comprises crystals extending horizontally with respect to said insulating surface, an axis of one of said crystals intersects with an axis of another one of said crystals at a constant angle.

72. A device according to claim 71 further comprising a gate electrode adjacent to the channel region with a gate insulating film interposed therebetween.

73. A device according to claim 72 wherein the gate electrode is located over the channel region.

74. A device according to claim 71 wherein said constant angle is about 60°.

75. A device according to claim 71 wherein said crystalline semiconductor film is an intrinsic type.

76. A device according to claim 71 wherein said crystalline semiconductor film has a thickness not larger than 1500 Å.

77. A device according to claim 71 wherein said crystalline semiconductor film contains a catalyst for promoting crystallization of said semiconductor film.

78. A device according to claim 77 wherein a concentration of said catalyst in said crystalline semiconductor film is not higher than $1 \times 10^{19}$ atoms/cm$^3$.

79. A device according to claim 71 wherein said substrate is a glass substrate having an insulating film formed thereon.

80. A device according to claim 71 wherein said semiconductor device is an active matrix type display device.

81. A device according to claim 71 wherein the semiconductor device has an image sensor.

82. A semiconductor device comprising:
- a crystalline semiconductor film formed over a substrate having an insulating surface, said crystalline semiconductor film having at least source, drain and channel regions,
- wherein said crystalline semiconductor film comprises crystals, an axis of said crystals having hexagonal symmetry with respect to [111] direction, and
- wherein an axis of one of said crystals intersects with an axis of another one of said crystals at a constant angle.

83. A device according to claim 82 further comprising a gate electrode adjacent to the channel region with a gate insulating film interposed therebetween.

84. A device according to claim 83 wherein the gate electrode is located over the channel region.

85. A device according to claim 82 wherein said constant angle is about 60°.

86. A device according to claim 82 wherein said crystalline semiconductor film is an intrinsic type.

87. A device according to claim 82 wherein said crystalline semiconductor film has a thickness not larger than 1500 Å.

88. A device according to claim 82 wherein said crystalline semiconductor film contains a catalyst for promoting crystallization of said semiconductor film.

89. A device according to claim 88 wherein a concentration of said catalyst in said crystalline semiconductor film is not higher than $1 \times 10^{19}$ atoms/cm$^3$.

90. A device according to claim 82 wherein said substrate is a glass substrate having an insulating film formed thereon.

91. A device according to claim 82 wherein said semiconductor device is an active matrix type display device.

92. A device according to claim 82 wherein the semiconductor device has an image sensor.

93. A device according to claim 82 wherein the semiconductor device comprises a sensor.

94. A semiconductor device comprising:
- a crystalline semiconductor film formed over a substrate having an insulating surface, said crystalline semiconductor film having at least source, drain and channel regions; and
- a gate electrode adjacent to said channel region with a gate insulating film interposed therebetween,
- wherein said crystalline semiconductor film comprises a plurality of crystals extending in <110> direction horizontally, and
- wherein an axis of one of said crystals intersects with an axis of another one of said crystals at a constant angle.

95. A device according to claim 94 wherein said semiconductor film contains a catalyst for promoting crystallization of said semiconductor film.

96. A device according to claim 95 wherein a concentration of said catalyst in said semiconductor film is not higher than $1 \times 10^{19}$ atoms/cm$^3$.

97. A device according to claim 94 wherein said substrate is a glass substrate having a base film formed thereon.

98. A device according to claim 94 wherein said semiconductor device comprises an active matrix type display device.

99. A device according to claim 94 wherein the semiconductor device comprises a sensor.

100. A device according to claim 99 wherein said semiconductor film contains a catalyst for promoting crystallization of said semiconductor film.

101. A device according to claim 99 wherein said substrate is a glass substrate having a base film formed thereon.

102. A device according to claim 94 wherein said semiconductor device comprises an active matrix type display device.

103. A semiconductor device comprising:
- a crystalline semiconductor film formed over a substrate having an insulating surface, said semiconductor film having at least source, drain and channel regions,
- wherein said crystalline semiconductor film comprises crystals extending in <110> direction horizontally with respect to said insulating surface, an axis of one of said crystals intersects with an axis of another one of said crystals at a constant angle.

104. A device according to claim 103 wherein a concentration of said catalyst in said semiconductor film is not higher than $1 \times 10^{19}$ atoms/cm$^3$.

105. A semiconductor device comprising:
- a crystalline semiconductor film formed over a substrate having an insulating surface, said crystalline semiconductor film having at least source, drain and channel regions; and
- a gate electrode over said channel region with a gate insulating film interposed therebetween,
- wherein said crystalline semiconductor film comprises a plurality of crystals extending in <110> direction horizontally, and
- wherein an axis of one of said crystals intersects with an axis of another one of said crystals at a constant angle.

106. A device according to claim 105 wherein said semiconductor film contains a catalyst for promoting crystallization of said semiconductor film.

107. A device according to claim 106 wherein a concentration of said catalyst in said semiconductor film is not higher than $1 \times 10^{19}$ atoms/cm$^3$.

108. A device according to claim 105 wherein said substrate is a glass substrate having a base film formed thereon.

109. A device according to claim 105 wherein said semiconductor device comprises an active matrix type display device.

110. A device according to claim 105 wherein the semiconductor device comprises a sensor.

111. A semiconductor device comprising:
- a crystalline semiconductor film formed over a substrate having an insulating surface, said semiconductor film having at least source, drain and channel regions,
- wherein crystals of said semiconductor film extend in <110> direction and an axis of one of said crystals intersects with an axis of another one of said crystals at a constant angle, and
- wherein said crystalline semiconductor film has a thickness of 1500 Å or less.

112. A device according to claim 111 wherein said semiconductor film contains a catalyst for promoting crystallization of said semiconductor film.

113. A device according to claim 112 wherein a concentration of said catalyst in said semiconductor film is not higher than $1 \times 10^{19}$ atoms/cm$^3$.

114. A device according to claim 111 wherein said substrate is a glass substrate having a base film formed thereon.

115. A device according to claim 111 wherein said semiconductor device comprises an active matrix type display device.

116. A device according to claim 111 wherein the semiconductor device comprises a sensor.

* * * * *